United States Patent
Leventis et al.

(10) Patent No.: US 7,253,660 B1
(45) Date of Patent: Aug. 7, 2007

(54) MULTIPLEXING DEVICE INCLUDING A HARDWIRED MULTIPLEXER IN A PROGRAMMABLE LOGIC DEVICE

(75) Inventors: Paul Leventis, Toronto (CA); Bruce Pedersen, San Jose, CA (US); Chris Lane, San Jose, CA (US); Srinivas Reddy, Fremont, CA (US); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 1046 days.

(21) Appl. No.: 10/305,886

(22) Filed: Nov. 27, 2002

Related U.S. Application Data

(60) Provisional application No. 60/334,276, filed on Nov. 28, 2001.

(51) Int. Cl.
*H01L 25/00* (2006.01)
*H03K 19/177* (2006.01)

(52) U.S. Cl. .......................... 326/41; 326/37; 326/47; 326/113

(58) Field of Classification Search ............ 326/37–41, 326/47, 113
See application file for complete search history.

(56) References Cited

U.S. PATENT DOCUMENTS 6,084,427 A    7/2000  Lee et al.
6,121,790 A    9/2000  Lee et al.
6,255,846 B1   7/2001  Lee et al.
6,278,288 B1   8/2001  Lee et al.
6,292,019 B1   9/2001  New et al.
6,384,625 B1   5/2002  Lee et al.
6,744,278 B1 * 6/2004  Liu et al. ...................... 326/41

* cited by examiner

*Primary Examiner*—Anh Q. Tran
(74) *Attorney, Agent, or Firm*—Beyer Weaver LLP

(57) ABSTRACT

A multiplexing device is described. In one embodiment, the multiplexing device includes: a hardwired multiplexer including a plurality of input terminals; a plurality of select terminals; and at least one output terminal, where the plurality of input terminals are coupled to a plurality of block input lines or a plurality of functional element input terminals. In one embodiment, the plurality of input terminals are hardwired to the plurality of block input lines or the plurality of functional element input terminals. In one embodiment, the plurality of select terminals are coupled to a second plurality of functional element input terminals or a plurality of functional element output terminals. In one embodiment, the plurality of block input lines include a plurality of logic array block (LAB) lines, the plurality of functional element input terminals include a plurality of logic element (LE) input terminals, and the plurality of functional element output terminals include LE output terminals. In another embodiment the multiplexing device includes: a hardwired multiplexer including a plurality of data signal input terminals; and a first plurality of LEs including a first plurality of LE output terminals, where the plurality of data signal input terminals are coupled to the first plurality of LE output terminals.

48 Claims, 5 Drawing Sheets

MULTIPLEXING DEVICE INCLUDING A HARDWIRED MULTIPLEXER IN A PROGRAMMABLE LOGIC DEVICE

CROSS-REFERENCE TO RELATED APPLICATIONS

This application claims the benefits of U.S. Provisional Application Ser. No. 60/334,276, filed Nov. 28, 2001, and entitled "High-Speed, Low Cost Dedicated Multiplexor Hardware in a PLD," which is incorporated herein by reference.

BACKGROUND OF THE INVENTION

1. Field of the Invention

This invention relates to programmable logic devices (PLDs), and more particularly to a method of implementing multiplexers through the addition of dedicated hardware in a PLD.

2. Description of the Related Art

A PLD is a digital, user-configurable integrated circuit used to implement a custom logic function. For the purposes of this description, the term PLD encompasses any digital logic circuit configured by the end-user, and includes a programmable logic array ("PLA"), a field programmable gate array ("FPGA"), and an erasable and complex PLD. The basic building block of a PLD is a logic element ("LE"). An LE is capable of performing logic functions on a number of input variables. Conventional PLDs combine together multiple LEs through an array of programmable interconnects to facilitate implementation of both simple and complex logic functions.

PLDs are frequently used for a variety of applications which require a large number of multiplexers. The multiplexers are typically implemented within PLDs as "soft" muxes. However, "soft" muxes can consume a large number of LEs within the PLD. For example, two four-input look-up tables (LUTs) are required to implement a simple 4:1 "soft" mux. Two of the inputs to the first LUT are used as multiplexer selection control signals. The third and fourth inputs of the first LUT are used as the first and second multiplexer input signals. The output of the first LUT is connected to an input of the second LUT. One multiplexer selection control signal from the first LUT is connected to an input of the second LUT and the third and fourth inputs of the second LUT are used as the third and fourth multiplexer input signals. Larger multiplexers, such as a 16:1 "soft" mux, require ten four-input LUTs comprising roughly twenty thousand transistors.

Another disadvantage of "soft" muxes within PLDs is that they can be relatively slow. For example, the first and second multiplexer input signals in the 4:1 "soft" mux described above must pass through two levels of logic before a multiplexer output signal is generated. Larger "soft" muxes used to perform wide fan-in multiplexing require some multiplexer input signals to pass through numerous logic levels before generating an output, thus slowing down the speed, efficiency, and economy with which PLDs can perform multiplexing operations. Although synthesis tools can be utilized to rearrange signal paths within a particular LUT, synthesis tools are not sophisticated enough to understand the structure of the overall circuit which is necessary for determining critical paths or rearranging signal paths between different LUTs.

The present invention addresses the above mentioned disadvantages.

SUMMARY OF THE INVENTION

The present invention encompasses a multiplexing device. In one embodiment, the multiplexing device includes: a hardwired multiplexer including a plurality of input terminals; a plurality of select terminals; and at least one output terminal, where the plurality of input terminals are coupled to a plurality of block input lines or a plurality of functional element input terminals. In one embodiment, the plurality of input terminals are hardwired to the plurality of block input lines or the plurality of functional element input terminals. In one embodiment, the plurality of select terminals are coupled to a second plurality of functional element input terminals or a plurality of functional element output terminals. In one embodiment, the plurality of block input lines include a plurality of logic array block (LAB) lines, the plurality of functional element input terminals include a plurality of logic element (LE) input terminals, and the plurality of functional element output terminals include LE output terminals.

In another embodiment the multiplexing device includes: a hardwired multiplexer including a plurality of data signal input terminals; and a first plurality of LEs including a first plurality of LE output terminals, where the plurality of data signal input terminals are coupled to the first plurality of LE output terminals.

The present invention is explained in more detail below with reference to the drawings.

DETAILED DESCRIPTION OF THE INVENTION

The present invention is directed to an apparatus and method of implementing multiplexers through the addition of dedicated hardware to any function block within a PLD. The following description is presented to enable any person skilled in the art to make and use the invention, and is provided in the context of a particular application and its requirements. Although the description below teaches various methods of implementing a 16:1 multiplexer through the addition of dedicated hardware in a PLD, the dedicated multiplexer may be any size and beneficially utilized in other types of IC devices, for example, Application Specific Integrated Circuits (ASICs). Therefore, the appended claims should not be limited to a method for implementing a 16:1 dedicated multiplexer in PLD applications. Furthermore, various modifications to the embodiments described herein will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
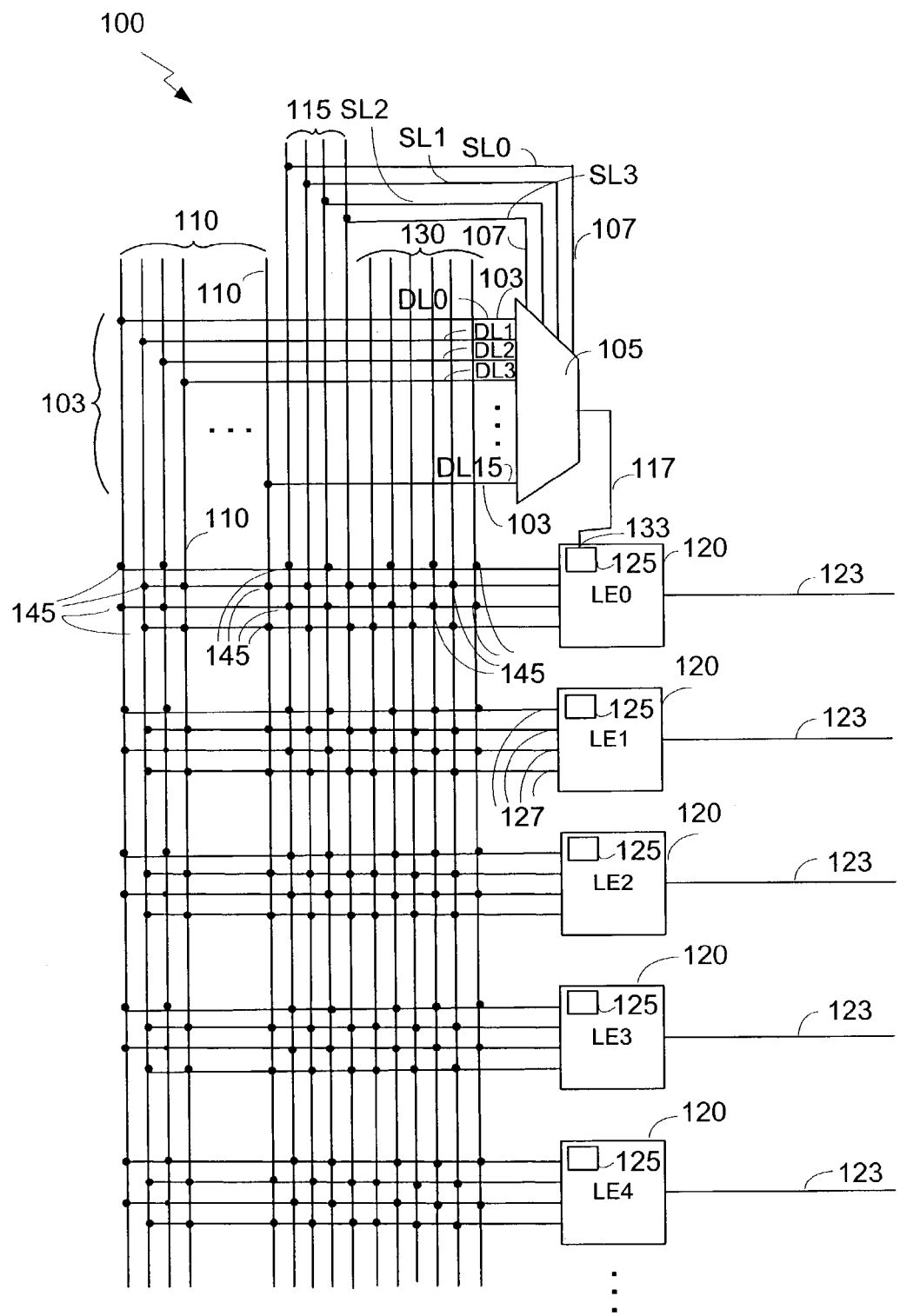
FIG. 1 shows a first embodiment of a multiplexing device including a hardwired multiplexer in a LAB.

FIG. 1 shows a first embodiment of a multiplexing device including a hardwired multiplexer 105 in a LAB 100 of a PLD. The hardwired multiplexer 105 of this first embodiment is a 16:1 multiplexer. However, the multiplexer 105 can be any size and more than one multiplexer 105 can be implemented in the LAB 100. Additionally, although multiplexer 105 is a 16:1 multiplexer, it may be used as a smaller size multiplexer, e.g., an 8:1 multiplexer. It is to be noted that hardwired multiplexer may herein be used interchangeably with dedicated multiplexer. More generally, as with the other multiplexers of the invention, the multiplexer 105 may be a M×N multiplexer, where M is an integer greater than or equal to 2 and N is an integer greater than or equal to 1.

The LAB 100 includes hardwired multiplexer 105, multiple LEs 120, multiple multiplexer data input LAB lines 110, multiple multiplexer select signal LAB lines 115 and multiple local lines 130. The LAB 100 also includes multiple LE input multiplexers. For a given LE input line 127, an LE input multiplexer includes the set of connections, such as connections 145, between the given LE input line 127 and the data input LAB lines 110, the select signal LAB lines 115 and the local lines 130. It is to be noted that, in FIG. 1, not all such connections between the LE input lines 127 and the data input LAB lines 110, the select signal LAB lines 115, and the local lines 130 have been referenced with the reference number 145 in order to avoid overcrowding the figure with reference numbers. The LE input multiplexers are controlled by configuration data from a random access memory (RAM) (not shown). Based on the configuration data, the LE input multiplexers select signals from one or more of the data input LAB lines 110, the select signal LAB lines 115, and local lines 130 for forwarding to the LEs 120.

The multiplexer 105 has multiple data input terminals 103 DL0 through DL15, multiple select input terminals 107 SL0 through SL3 and an output terminal 117. The multiplexer data input terminals 103 are coupled to the multiplexer data input LAB lines 110. More specifically, each of the multiplexer data input terminals 103 is coupled to a corresponding one of the multiplexer data input LAB lines 110, such that each of the multiplexer data input terminals 103 is coupled to a separate one of the multiplexer data input LAB lines 110. In one embodiment, each of the multiplexer data input terminals 103 is hardwired to the corresponding one of the multiplexer data input LAB lines 110. Similarly, the multiplexer select input terminals are coupled to the multiplexer select signal LAB lines 115. More specifically, each of the multiplexer select input terminals 107 is coupled to a corresponding one of the multiplexer select signal LAB lines 115, such that each of the multiplexer select input terminals 107 is coupled to a separate one of the multiplexer select signal LAB lines 115. In one embodiment, each of the multiplexer select input terminals 107 is hardwired to the corresponding one of the multiplexer select signal LAB lines 115. The multiplexer output terminal 117 is coupled to a cascade input terminal 133 of the LUT 125 located within the logic element LE0.

Each LE 120 has multiple input terminals 127, an output terminal 123 and a LUT 125. In one embodiment, each of the LE output terminals 123 is coupled to the local lines 130. The local lines 130 may include more than the six local lines shown in FIG. 1. In one embodiment, the number of local lines 130 in LAB 100 corresponds to the number of LEs 120 in LAB 100. Each LE input terminal 127 of each LE 120 can receive signals from one of the multiple multiplexer data input LAB lines 110, the multiple multiplexer select signal LAB lines 115, or the multiple local lines 130. The source of the signal depends on which of connections 145 is selected by the corresponding LE input multiplexer.

It is to be noted that data input LAB lines 110 are not limited to carrying data input signals to the multiplexer 105. For example, when multiplexer 105 is used as a multiplexer smaller than a 16:1 multiplexer, e.g., a 4:1 multiplexer, then the 4:1 multiplexing function is independent of the signals carried on 12 of the 16 data input LAB lines 110. Thus, those 12 of the 16 data input LAB lines may carry any type of signal. For example, they may carry data signals, select signals, clock signals, clear signal, or some other signals to the LEs 120. Similarly, when, for example, the multiplexer 105 functions as a 4:1 multiplexer, then the 4:1 multiplexing function is independent of the signals carried on 2 of the 4 select signal LAB lines 115. Thus, those 2 of the 4 select signal LAB lines may carry any type of signal. For example, they may carry data signals, select signals, clock signals, clear signals, or some other signals to the LEs 120. Moreover, it is to be noted that although lines 110 and 115 are herein referred to as data input LAB lines 110 and select signal LAB lines 115, they are both LAB lines and may more generally be referred to as LAB lines. Additionally, although only 16 data input LAB lines 110 and 4 select signal LAB lines 115 are shown in FIG. 1, LAB 100 may include additional LAB lines for carrying data signals, select signals, clock signals, clear signals, or some other signals to the LEs 120.

The multiplexer 105 receives data input signals D0 through D15 from the multiplexer data input LAB lines 110, select signals S0 through S3 from the multiplexer select signal LAB lines 115 and generates an output signal based on the multiplexer select signals. The output signal is then transmitted to the cascade input 133 of the LUT 125 located within the logic element LE0. A user can program the LUT 125 within the logical element LE0 to manipulate the multiplexer output signal or to simply pass the multiplexer output signal to the output terminal 123 of the logical element LE0. In another embodiment, the multiplexer output terminal 117 can be connected directly to other components such as multiplexers within the PLD which may be used to drive the routing, thus bypassing the logic element LE0.

As noted above, each of the multiplexer data input terminals 103 is coupled to a corresponding one of the multiplexer data input LAB lines 110. Accordingly, in one embodiment, each of the multiplexer data input signals is routed to and arrives at the corresponding one of the multiplexer data input LAB lines 110 which is coupled to the corresponding one of the multiplexer data input terminals 103 on which the multiplexer data input signal is to be received. Similarly, as noted above, each of the multiplexer select input terminals 107 is coupled to a corresponding one of the multiplexer select signal LAB lines 115. Accordingly, each of the multiplexer select input signals is routed to and arrives at the corresponding one of the multiplexer select signal LAB lines 115 which is coupled to the corresponding one of the multiplexer select input terminals on which the multiplexer select input signal is to be received. For example, if the multiplexer data input terminal DL0 is hardwired to the first multiplexer data input LAB line 110, then the data input signal D0 is routed to and arrives on the first multiplexer data input LAB line 110. Similarly, if the multiplexer select input terminal SL0 is hardwired to the first multiplexer select signal LAB line 115, then the select signal S0 is routed to and arrives on the first multiplexer select signal LAB line 115.

It is to be noted that the amount of hardware required and the cost of implementing the multiplexer 105 is significantly less than prior art "soft muxes" implemented in PLDs. In particular, the multiplexer data input signals and the multiplexer select signals do not pass through input multiplexers since the multiplexer data input terminals 103 and the multiplexer select input terminals 107 are directly hardwired to separate LAB lines. Eliminating the need for input multiplexers increases the operation speed of the multiplexer 105. Furthermore, with the exception of LE0, which is used to route the output of the multiplexer 105, the multiplexer 105 does not utilize any LEs 120. Thus, with the exception of LE0, all LEs 120 within the LAB 100 remain available for other user logic. It is also to be noted that, in the case where the multiplexer output terminal 117 bypasses the logic element LE0, all the LEs 120 within the LAB 100 remain available for other user logic.

Figure 2:
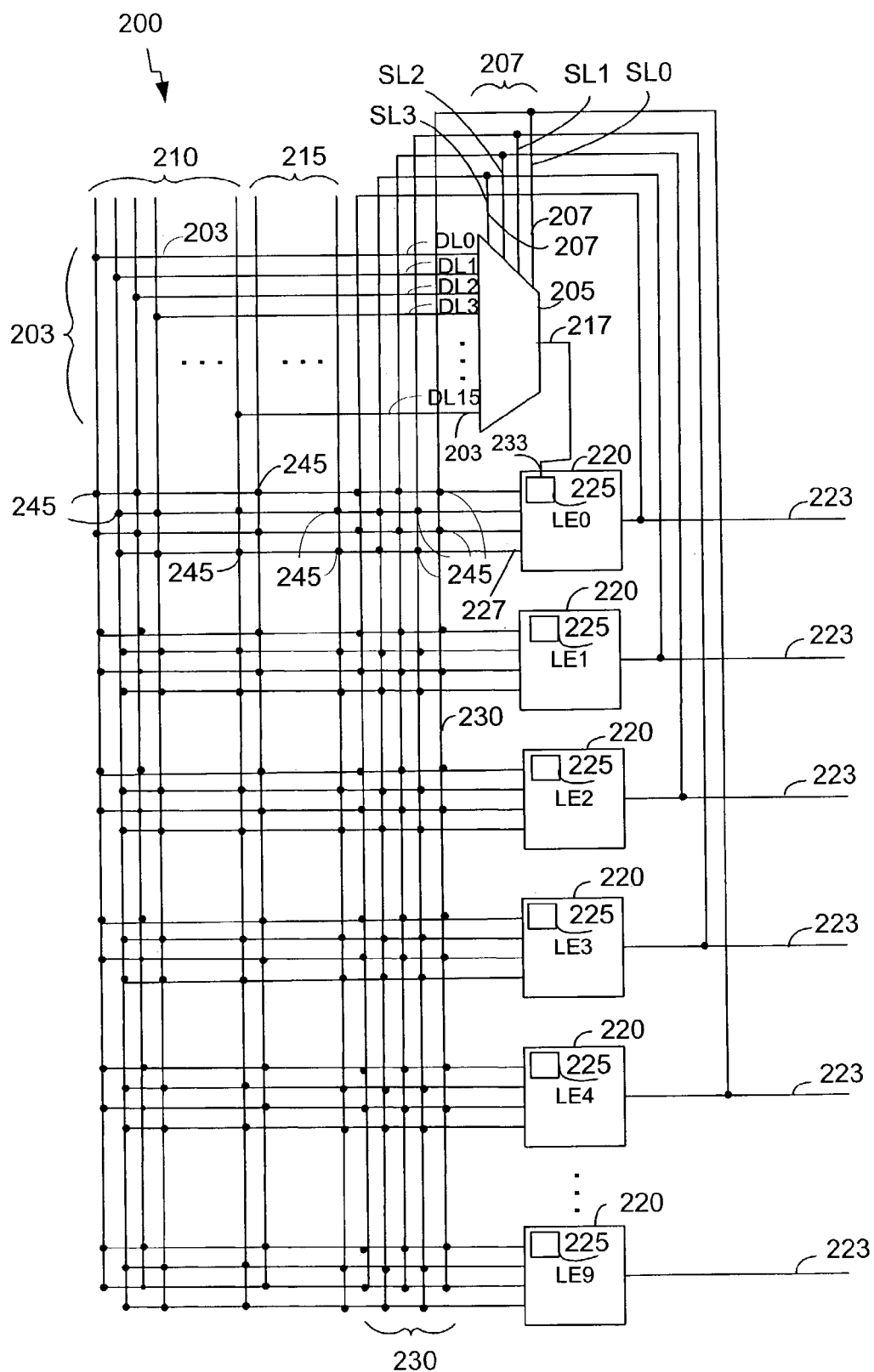
FIG. 2 shows a second embodiment of a multiplexing device including a hardwired multiplexer in a LAB.

FIG. 2 shows a second embodiment of a multiplexing device including a hardwired multiplexer 205 in a LAB 200 of a PLD. In the embodiment shown in FIG. 2, the multiplexer 205 is a 16:1 multiplexer. However, the multiplexer 205 can be any size and more than one multiplexer 205 can be implemented in the LAB 200. Additionally, although multiplexer 205 is a 16:1 multiplexer, it may be used as a smaller size multiplexer, e.g., an 8:1 multiplexer.

The LAB 200 includes hardwired multiplexer 205, multiple LEs 220, multiple multiplexer data input LAB lines 210, multiple multiplexer select signal LAB lines 215, and multiple local lines 230. The LAB 200 also includes multiple LE input multiplexers. For a given LE input line 227, an LE input multiplexer includes the set of connections, such as connections 245, between the given LE input line 227 and the data input LAB lines 210, the select signal LAB lines 215 and the local lines 230. It is to be noted that, in FIG. 2, not all such connections between the LE input lines 227 and the data input LAB lines 210, the select signal LAB lines 215, and the local lines 230 have been referenced with the reference number 245 in order to avoid overcrowding the figure with reference numbers. The LE input multiplexers are controlled by configuration data from a random access memory (RAM) (not shown). Based on the configuration data, the LE input multiplexers select signals from one or more of the data input LAB lines 210, the select signal LAB lines 215, and local lines 230 for forwarding to the LEs 220.

The hardwired multiplexer 205 has multiple data input terminals 203 DL0 through DL15, multiple select input terminals 207 SL0 through SL3 and an output terminal 217. In one embodiment, each of the LE output terminals 223 is coupled to the local lines 230. The local lines 230 may include more than the five local lines shown in FIG. 2. In one embodiment, the number of local lines 230 in LAB 200 corresponds to the number of LEs 220 in LAB 200. Each LE 220 has multiple input terminals 227, an output terminal 223 and a LUT 225. Each LE input terminal 227 of each LE 220 can receive signals from one of the multiple multiplexer data input LAB lines 210, the multiple multiplexer select signal LAB lines 215, or the multiple local lines 230. The source of the signal depends on which of connections 245 is selected by the corresponding LE input multiplexer.

It is to be noted that data input LAB lines 210 are not limited to carrying data input signals to the multiplexer 205. For example, when multiplexer 205 is used as a multiplexer smaller than a 16:1 multiplexer, e.g., a 4:1 multiplexer, then the 4:1 multiplexing function is independent of the signals carried on 12 of the 16 data input LAB lines 210. Thus, those 12 of the 16 data input LAB lines may carry any type of signal. For example, they may carry data signals, select signals, clock signals, clear signals, or some other signals to the LEs 220. Similarly, when, for example, the multiplexer 205 functions as a 4:1 multiplexer, then the 4:1 multiplexing function is independent of the signals carried on 2 of the 4 select signal LAB lines 215. Thus, those 2 of the 4 select signal LAB lines may carry any type of signal. For example, they may carry data signals, select signals, clock signals, clear signals, or some other signals to the LEs 220. Moreover, it is to be noted that although lines 210 and 215 are herein referred to as data input LAB lines 210 and select signal LAB lines 215, they are both LAB lines and may more generally be referred to as LAB lines. Additionally, although LAB 200 is shown in FIG. 2 to include only 16 data input LAB lines 210 and is described above with reference to an embodiment that includes only 4 select signal LAB lines 215, generally LAB 200 may include additional LAB lines for carrying data signals, select signals, clock signals, clear signals, or some other signals to the LEs 220.

The multiplexer data input terminals 203 are coupled to the multiplexer data input LAB lines 210. More specifically, each of the multiplexer data input terminals 203 is coupled to a corresponding one of the multiplexer data input LAB lines 210, such that each of the multiplexer data input terminals 203 is coupled to a separate one of the multiplexer data input LAB lines 210. In one embodiment, each of the multiplexer data input terminals 203 is hardwired to the corresponding one of the multiplexer data input LAB lines 210. Similarly, the multiplexer select input terminals are coupled to the output terminals of logic elements in LAB 200. More specifically, each of the multiplexer select input terminals 207 SL3 through SL0 is coupled to a corresponding one of the output terminals 223 of the logic elements LE1 through LE4 in LAB 200, such that the multiplexer select input terminals 207 SL3 through SL0 are coupled the output terminals 223 of the logic elements LE1 through LE4, respectively. The logic elements LE1 through LE4 provide select signals to the multiplexer select input terminals 207 SL3 through SL0, respectively. In one embodiment, each of the multiplexer select input terminals 207 is hardwired to the corresponding one of the output terminals 223 of the logic elements LE1, LE2, LE3, and LE4 in LAB 200. The hardwired multiplexer output terminal 217 is coupled to the cascade input terminal 233 of the LUT 225 located within the logic element LE0.

In a first implementation of a multiplexing device including the hardwired multiplexer 205 within LAB 200 of a PLD, a user can program the configuration RAM so that the appropriate LE input multiplexers select the multiplexer select input signals S3, S2, S1, and S0 from any of the multiple multiplexer select signal LAB lines 215, the multiple multiplexer data signal LAB lines 210, or the local lines 230. The multiplexer select signals S3, S2, S2 and S0 are transmitted to the logic elements LE1, LE2, LE3 and LE4, respectively. The logic elements LE1, LE2, LE3 and LE4 then output the multiple select signals S3, S2, S1 and S0, respectively, and transmit them to the appropriate hardwired multiplexer select input terminals 207. The hardwired multiplexer 205 then generates an output signal based on the multiplexer select signals. The output signal is then transmitted to the cascade input 233 of the LUT 225 located within the logic element LE0. A user can program the LUT 225 within the logical element LE0 to manipulate the multiplexer output signal or to simply pass the multiplexer output signal to the output 223 of the logical element LE0. In another embodiment, the multiplexer output terminal 217 can be connected directly to other components such as multiplexers within the PLD which may be used to drive the routing, thus bypassing the logic element LE0.

For example, if the multiplexer select signal S0 is routed to the third multiplexer select signal LAB line 215, a user can program the configuration RAM so that the appropriate LE input multiplexer selects S0 from the third multiplexer select signal LAB line 215 and transmits it to the logic element LE4. The multiplexer select signal S0 is then transmitted from the logic element LE4 to the appropriate hardwired multiplexer select input terminal 207. Similarly, if multiplexer select signal S1 is routed to the seventh multiplexer select signal LAB line 215, a user can program the configuration RAM so that the appropriate LE input multiplexer selects S1 from the seventh multiplexer select signal LAB line 215 and transmits it to the logic element LE3. The multiplexer select signal S1 is then transmitted from the logic element LE3 to the appropriate hardwired multiplexer select input terminal 207.

The first implementation of the multiplexer device including the hardwired multiplexer 205 within LAB 200 of the PLD provides an advantage over the prior art by reducing the amount of hardware required to implement any size multiplexer within a PLD. In particular, only five LEs 220 within the LAB 200 are utilized to implement the multiplexing device. All other LEs 220 in the LAB 200 remain available for other user logic. Reducing the amount of hardware required lowers the cost required to implement the multiplexing device and increases its speed of operation. The first implementation of the multiplexing device also provides for greater flexibility in routing. In the first implementation of the multiplexing device, the multiplexer select signals can be routed to any of the multiple multiplexer select signal LAB lines 215.

Although each of the multiple data input terminals 203 are coupled to separate multiplexer data input LAB lines 210, each of the multiplexer data input signals need not be routed to and arrive at the corresponding multiplexer data input LAB lines 210. In other words, data input signals D0 to D15 need not be routed to and arrive at multiplexer data input lines 203 DL0 to DL15, respectively. In a second implementation of the multiplexing device including the hardwired multiplexer 205, the configuration RAM may be programmed so that the appropriate LE input multiplexers select the multiplexer select signals S3, S2, S1 and S0 from any of the multiple multiplexer select signal LAB lines 215. Each of the multiplexer select signals S3, S2, S1 and S0 is transmitted to each of the logic elements LE1, LE2, LE3 and LE4. The LUTs 225 within LE1, LE2, LE3 and LE4 may also be programmed to remap the multiplexer select signals so that the data signal on the proper data input line 203 is selected.

In one example, the multiplexer data input signal D0 may be routed to the third multiplexer data input LAB line 210 and the multiplexer select signals S3=0, S2=0, S1=0, and S0=0 may be routed to the fifth, third, seventh and tenth multiplexer select signal LAB lines 215, respectively. The configuration RAM may be programmed so that the appropriate LE input multiplexers select S3, S2, S1 and S0 from the fifth, third, seventh and tenth multiplexer select signal LAB lines 215, respectively. All four multiplexer select signals 0000 are transmitted to each of the logic elements LE1, LE2, LE3 and LE4. The LUTs 225 within LE1, LE2, LE3 and LE4 may also be programmed to output the output signals 0, 0, 1 and 1, respectively. Thus, the logic elements LE1 through LE4 effectively remap the multiplexer select signals 0000 to 0011 to ensure that the hardwired multiplexer 205 functions correctly. The multiplexer select signals 0011 are then transmitted to the hardwired multiplexer select input terminals 207 SL3, SL2, SL1 and SL0, respectively. The hardwired multiplexer 205 then outputs the data signal D0 from the third multiplexer data input terminal 203 DL2. The output signal is then transmitted to the cascade input 233 of the LUT 225 located within the logic element LE0. The LUT 225 within the logical element LE0 may be programmed to manipulate the multiplexer output signal or to simply pass the multiplexer output signal to the output 223 of the logical element LE0. In another embodiment, the multiplexer output terminal 217 can be coupled directly to other components such as multiplexers within the PLD which may be used to drive the routing, thus bypassing the logic element LE0.

This second implementation of the multiplexing device including hardwired multiplexer 205 implemented within the LAB 200 of a PLD provides an advantage over the prior art by reducing the amount of hardware required to implement a multiplexer within a PLD. In particular, only five LEs 220 within the LAB 200 are utilized to implement the multiplexing device. All other LEs 220 in the LAB 200 remain available for other user logic. Reducing the amount of hardware required lowers the cost required to implement the multiplexing device and increases its speed of operation.

The second implementation of the multiplexing device including hardwired multiplexer 205 implemented within the LAB 200 of a PLD provides for greater flexibility in routing. In the second implementation, the multiplexer select signals can be routed to any of the multiple multiplexer select signal LAB lines 215, the multiple multiplexer data signal LAB lines 210, or the local lines 230. Furthermore, the multiple multiplexer data input signals can be routed to any one of the multiplexer data input LAB lines 210.

Figure 3:
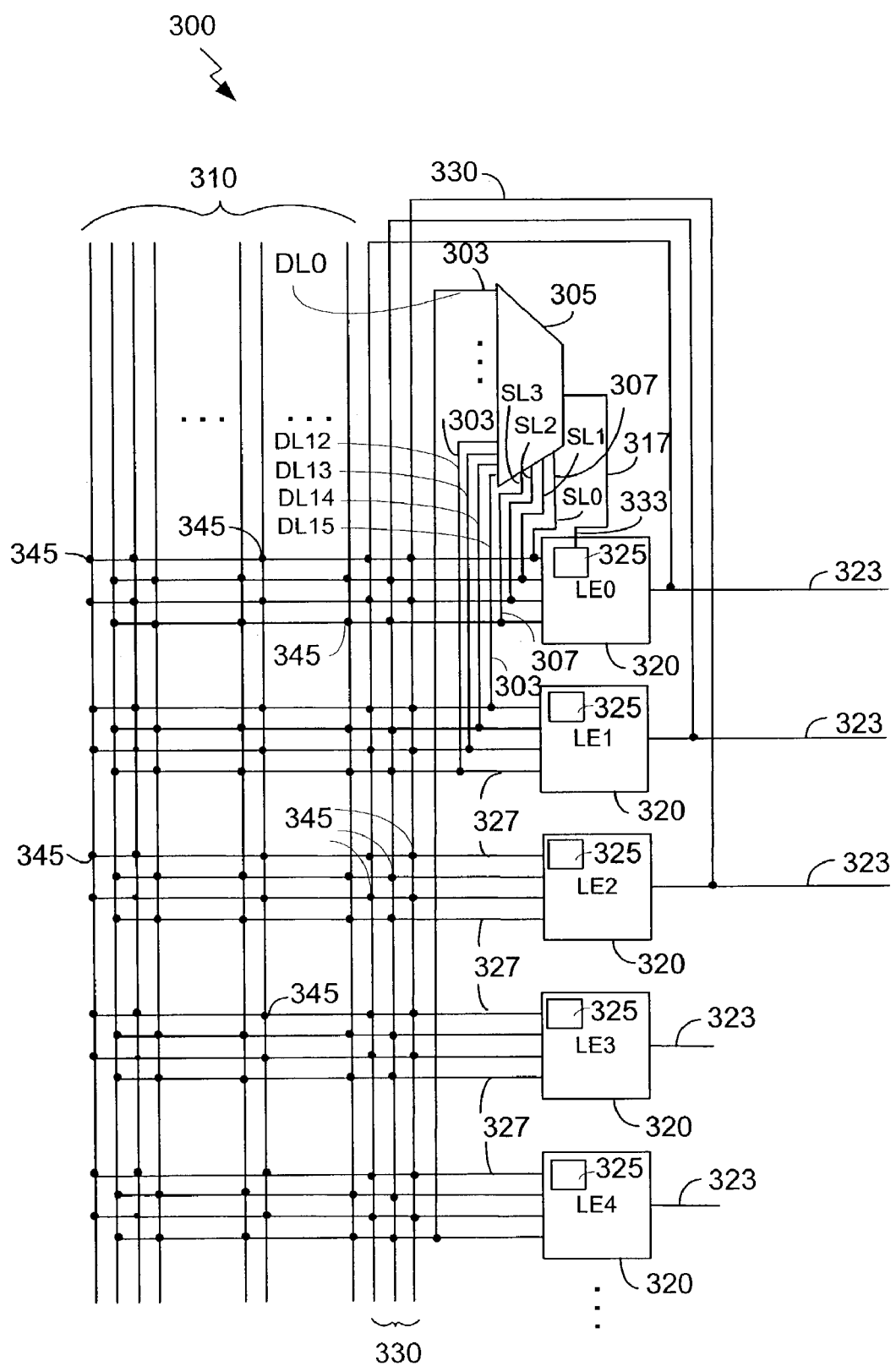
FIG. 3 shows a third embodiment of a multiplexing device including a hardwired multiplexer in a LAB.

FIG. 3 shows a third embodiment of a multiplexing device including a hardwired multiplexer 305 in a LAB 300 of a PLD. In the embodiment shown in FIG. 3, the hardwired multiplexer 305 is a 16:1 multiplexer. However, the multiplexer 305 can be any size and more than one multiplexer can be implemented in the LAB 300. Additionally, although multiplexer 305 is a 16:1 multiplexer, it may be used as a smaller size multiplexer, e.g., an 8:1 multiplexer.

The LAB 300 includes hardwired multiplexer 305, multiple LEs 320, multiple LAB lines 310, and multiple local lines 330. The LAB 300 also includes multiple LE input multiplexers. For a given LE input line 327, an LE input multiplexer includes the set of connections, such as connections 345, between the given LE input line 327 and the LAB lines 310 and the local lines 330. It is to be noted that, in FIG. 3, not all such connections between the LE input lines 327 and the LAB lines 310 and the local lines 330 have been referenced with the reference number 345 in order to avoid overcrowding the figure with reference numbers. The LE input multiplexers are controlled by configuration data from a random access memory (RAM) (not shown). Based on the configuration data, the LE input multiplexers select signals from one or more of the LAB lines 310 and local lines 330 for forwarding to the LEs 320.

The LAB lines 310 carry both data input signals and select signals for LAB 300. The LAB lines 310 may also carry other signals that may be input to the LEs 320 for other purposes. For example, they may carry clock signals, clear signals, or some other signals to the LEs 320.

The hardwired multiplexer 305 has multiple data input terminals 303 DL0 through DL15, multiple select input terminals 307 SL0 through SL3, and an output terminal 317. Each LE 320 has multiple input terminals 327, an output terminal 323, and a LUT 325. In one embodiment, each of the LE output terminals 323 is coupled to the local lines 330. The local lines 330 may include more than the three local lines shown in FIG. 3. In one embodiment, the number of local lines 330 in LAB 300 corresponds to the number of LEs 320 in LAB 300. Each LE input terminal 327 of each LE 320 can receive signals from one of the LAB lines 310 or the local lines 330. The source of the signal depends on which of connections 345 is selected by the corresponding LE input multiplexer.

The multiplexer data input terminals 303 are coupled to input terminals 327 of logic elements LE1, LE2, LE3 and LE4. More specifically, each of the multiplexer data input terminals 303 DL0 through DL15 is coupled to a corresponding one of the input terminals 327 of logic elements LE1, LE2, LE3 and LE4, such that each of the multiplexer data input terminals 303 DL0 through DL15 is coupled to a separate one of the input terminals 327 of logic elements LE1, LE2, LE3 and LE4. In one embodiment, each of the multiplexer data input terminals 303 is hardwired to the corresponding one of the input terminals 327 of logic elements LE1, LE2, LE3 and LE4. Similarly, the multiplexer select input terminals are coupled to the input terminals 327 of the logic element LE0. More specifically, each of the multiplexer select input terminals 307 SL0 through SL3 is coupled to a corresponding one of the input terminals 327 of the logic element LE0, such that each of the multiplexer select input terminals 307 SL0 through SL3 is coupled to a separate one of the input terminals 327 of the logic element LE0. In one embodiment, each of the multiplexer select input terminals 307 is hardwired to the corresponding one of the input terminals 327 of the logic element LE0. The multiplexer output terminal 317 is coupled to the cascade input terminal 333 of the LUT 325 located within the logic element LE0.

The configuration RAM may be programmed so that the appropriate LE input multiplexers select the multiplexer data input signals from any one of the LAB lines 310 or local lines 330 and transmit them to the appropriate hardwired multiplexer input terminals 303. Similarly, the configuration RAM may be programmed so that the appropriate LE input multiplexers select the multiplexer select signals from any one of the LAB lines 310 or local lines 330 and transmit them to the appropriate hardwired multiplexer select input terminals 307. The multiplexer 305 generates an output signal based on the multiplexer select signals. The output signal is transmitted to the cascade input 333 of the LUT 325 located within the logic element LE0. The LUT 325 within the logical element LE0 may be programmed to manipulate the multiplexer output signal or to simply pass the multiplexer output signal to the output 323 of the logical element LE0. In another embodiment, the multiplexer output terminal 317 can be coupled directly to other components such as multiplexers within the PLD which may be used to drive the routing, thus bypassing the logic element LE0.

In the case that the hardwired multiplexer 305 is not being utilized, the configuration RAM may be programmed so that the appropriate LE input multiplexers select LE input signals from any one of the LAB lines 310 and local lines 330 and transmit them to the appropriate LEs 320. This allows the LEs 320 within the LAB 300 to function in their normal capacity when the hardwired multiplexer 305 is not being used. Similarly, when the multiplexer 305 is used as a smaller than 16:1 multiplexer, the LE input terminals that do not carry signals used in the multiplexer 305 may be used to carry signals for use by their corresponding LEs 320. As explained above, the LE input terminals receive signals from the LAB lines 310 or the local lines 330. It is also possible that both the hardwired multiplexer 305 and any one or more of the LEs 320 may simultaneously utilize one more of the data input signals or the select signals selected by the LE input multiplexers from the LAB lines 310 or local lines 330. In this case, the configuration RAM may be programmed to direct one or more of the selected signals to the hardwired multiplexer 305 and any one or more of LEs 320.

The third embodiment of the multiplexing device including the hardwired multiplexer 305 implemented within the LAB 300 of a PLD provides advantage over the prior art by reducing the amount of hardware required to implement a multiplexing device within a PLD. In particular, the LE multiplexers of five LEs 320 within LAB 300 are utilized to implement the multiplexing device. It is to be noted that even these five LEs 320 remain available to perform functions on the signals that they receive. It is also to be noted that all other LEs 320 in the LAB 300 remain completely available for other user logic. In other words, both their LE input multiplexers and their internal logic circuits remain available for other user logic. Reducing the amount of hardware required lowers the cost required to implement the multiplexing and increases its speed of operation. This implementation of the multiplexing device also provides greater flexibility in routing. The multiple multiplexer data input signals and the multiple multiplexer select signals can be routed to any of the LAB lines 310 or local lines 330.

Figure 4:
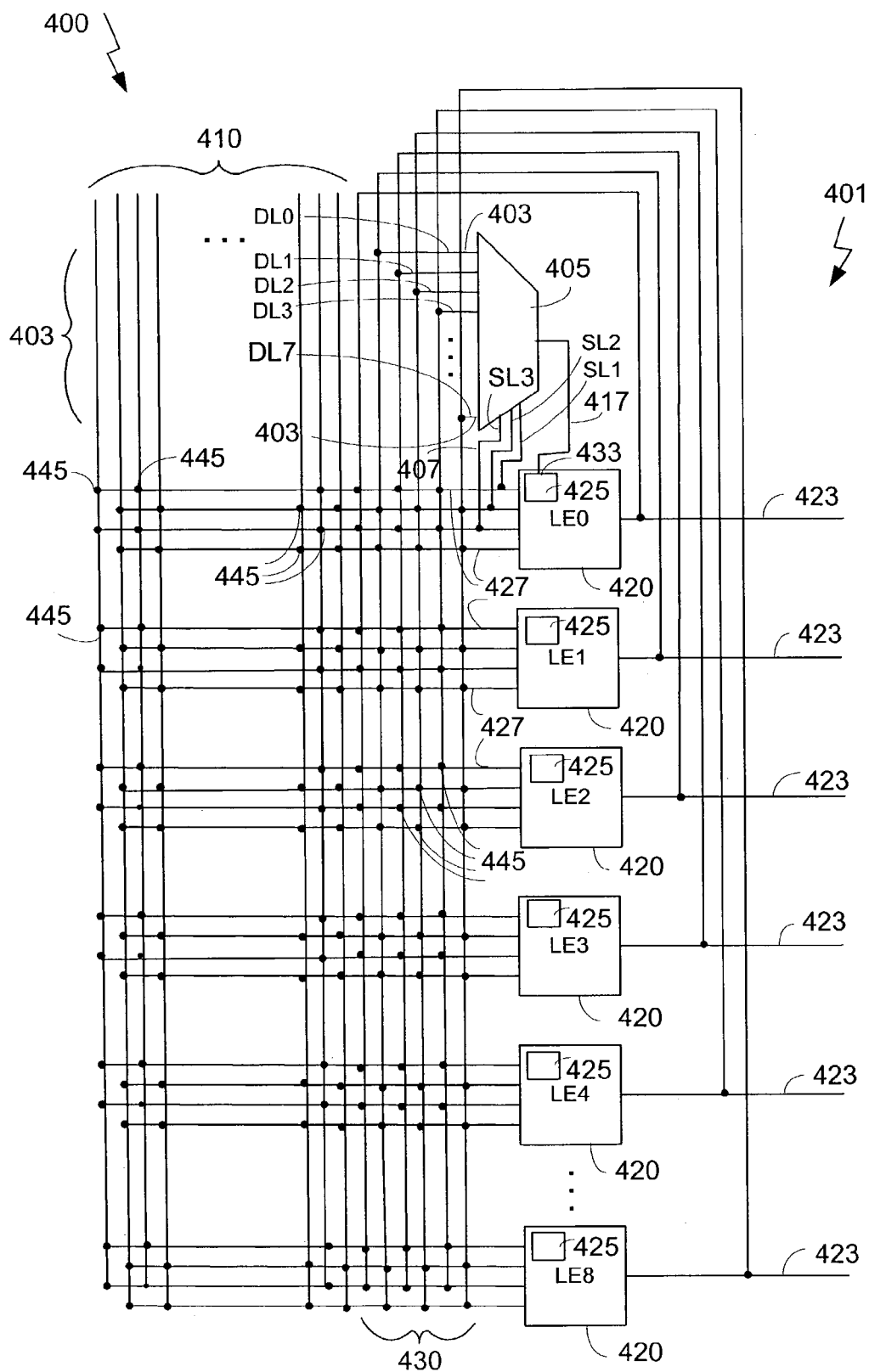
FIG. 4 shows a fourth embodiment of a multiplexing device including a hardwired multiplexer in a LAB.

FIG. 4 shows a fourth embodiment of a multiplexing device 401 including a hardwired multiplexer 405 in a LAB 400 of a PLD. The LAB 400 includes hardwired multiplexer 405, multiple LEs 420, multiple LAB lines 410, and multiple local lines 430. The LAB lines 410 carry both data input signals, select signals, and other signals for LAB 400. The LAB 400 also includes multiple LE input multiplexers. For a given LE input line 427, an LE input multiplexer includes the set of connections, such as connections 445, between the given LE input line 427 and the LAB lines 410 and the local lines 430. It is to be noted that, in FIG. 4, not all such connections between the LE input lines 427 and the LAB lines 410 and the local lines 430 have been referenced with the reference number 445 in order to avoid overcrowding the figure with reference numbers. The LE input multiplexers are controlled by configuration data from a random access memory (RAM) (not shown). Based on the configuration data, the LE input multiplexers select signals from one or more of the LAB lines 410 and local lines 430 for forwarding to the LEs 420.

The multiplexing device 401 includes the hardwired multiplexer 405 and several of the LEs 420, more specifically, LE0 to LE8. The hardwired multiplexer 405 has multiple data input terminals 403 DL0 through DL7, multiple select terminals 407 SL1 through SL3 and an output terminal 417. Each LE 420 has multiple input terminals 427, an output terminal 423 and a LUT 425. As shown in FIG. 4, each LE output terminal 423 is coupled to the local lines 430. Each LE input terminal 427 of each LE 420 can receive signals from one of the LAB lines 410 or the local lines 430. The source of the signal depends on which of connections 445 is selected by the appropriate LE input multiplexer.

The hardwired multiplexer data input terminals 403 DL0 through DL7 are coupled to the output terminals 423 of the logic elements LE1 through LE8. More specifically, each of the multiplexer data input terminals 403 is coupled to a corresponding one of the output terminals 423 of logic elements LE1 through LE8, such that multiplexer data input terminals 403 DL0 through DL7 are coupled to the output terminals 423 of the logic elements LE1 through LE8, respectively. In one embodiment, each of the multiplexer data input terminals 403 is hardwired to the corresponding one of the output terminals 423 of logic elements LE1 through LE8. Similarly, the hardwired multiplexer select input terminals 407 SL1, SL2 and SL3 are coupled to three input terminals 427 of the logic element LE0. More specifically, each of the multiplexer select input terminals 407 is coupled to a corresponding one of the input terminals 427 of the logic element LE0, such that each of the multiplexer select input terminals 407 is coupled to a separate input terminal 427 of the logic element LE0. In one embodiment, each of the multiplexer select input terminals 407 is hardwired to the corresponding one of the input terminals 427 of the logic element LE0. The multiplexer output terminal 417 is coupled to the cascade input terminal 433 of the LUT 425 located within the logic element LE0.

A first implementation of this fourth embodiment of the multiplexing device 401 having dedicated hardware implemented in a LAB 400 of a PLD uses the combination of eight 2:1 soft multiplexers (which in the embodiment shown in FIG. 4 are implemented using LE1 through LE8) and the dedicated 8:1 multiplexer 405 to achieve a 16:1 multiplexer. However, any size multiplexer can be implemented. Additionally, although the multiplexing device 401 is a 16:1 multiplexer, it may be used as a smaller size multiplexer, e.g., an 8:1 multiplexer. The configuration RAM may be programmed so that the appropriate LE input multiplexers select the multiplexer data input signals from the LAB lines 410 or local lines 430. Two multiplexer data input signals are transmitted to each of the logic elements LE1 through LE8. For example, multiplexer data input signals D0 and D1 are input into the logic element LE1, multiplexer data input signals D2 and D3 are input into the logic element LE2, and multiplexer data input signals D14 and D15 are input into logic element LE8.

The configuration RAM may also be programmed so that the appropriate LE input multiplexers select the multiplexer select signals S0 through S3 from the LAB lines 410 or local lines 430. The multiplexer select signal S0 is transmitted to each of the logic elements LE1 through LE8. Additionally, the multiplexer select signals S1 through S3 are directed to the first three LE input terminals 427 of logic element LE0 which are coupled to the hardwired multiplexer select input terminals 407.

As noted above, the logic elements LE1 through LE8 function as 2:1 soft multiplexers. Each logic element LE1 through LE8 receives two multiplexer data input signals and a multiplexer select signal S0. Each logic element LE1 through LE8 outputs one of its two multiplexer data input signals based on the multiplexer select signal S0, thus reducing the sixteen multiplexer data input signals down to eight. The output signals from the logic elements LE1 through LE8 are then transmitted to the appropriate hardwired multiplexer data input terminals 403. The hardwired multiplexer 405 generates an output signal based on the multiplexer select signals S1 through S3. The output signal is transmitted from the multiplexer output terminal 417 to the cascade input 433 of the LUT 425 located within the logic element LE0. The LUT 425 within the logical element LE0 may be programmed to manipulate the multiplexer output signal or to simply pass the multiplexer output signal to the output terminal 423 of the logical element LE0. In another embodiment, the multiplexer output terminal 417 can be connected directly to other components such as multiplexers within the PLD which may be used to drive the routing, thus bypassing the logic element LE0.

In a second implementation of this fourth embodiment of the multiplexing device 401 having dedicated hardware implemented in a LAB 400 of a PLD, the logic elements LE1 through LE8 may be used to generate multiplexer data input signals for the hardwired multiplexer 405. The configuration RAM may be programmed so that the appropriate LE input multiplexers select LE input signals from the LAB lines 410 or local lines 430. The LE input signals are then transmitted to the appropriate logic elements LE1 through LE8. The configuration RAM may also be programmed so that the appropriate LE input multiplexers select the multiplexer select signals S0 through S3 from the LAB lines 410 or local lines 430 and forward the select signals S0 through S3 to the appropriate LEs. As noted above, in the example of FIG. 4, select signal S0 is selected and transmitted to logic elements LE1 through LE8, while select signals S1 through S3 are selected and transmitted to logic element LE0. In FIG. 4, three of the input terminals of LE0 are coupled to the multiplexer select input terminals 407. These three input terminals of the logic element LE0 receive the select signals S1 through S3 and forward them to the multiplexer select input terminals 407.

The LUTs 425 within the logic elements LE1 through LE8 may be programmed to output multiplexer data input signals based on the LE input signals. The multiplexer data input signals are then transmitted from the output terminals 423 of the logic elements LE1 through LE8 to the appropriate hardwired multiplexer data input terminals 403. The hardwired multiplexer 405 generates an output signal based on the multiplexer select signals. The output signal is transmitted from the multiplexer output terminal 417 to the cascade input 433 of the LUT 425 located within the logic element LE0. The LUT 425 within the logical element LE0 may be programmed to manipulate the multiplexer output signal or to simply pass the multiplexer output signal to the output 423 of the logical element LE0. In another embodiment, the multiplexer output terminal 417 may be coupled directly to other multiplexers which drive the routing, thus bypassing the logic element LE0.

The fourth embodiment of the multiplexing device 401 having dedicated hardware implemented in LAB 400 of a PLD provides an advantage over the prior art "soft muxes" in that it requires less hardware. Reducing the amount of hardware required lowers the cost required to implement the multiplexing device 401 and increases the operation speed of the multiplexing device 401. The multiplexing device 401 also provides for greater flexibility in routing. In particular, the multiple multiplexer data input signals and the multiple multiplexer select signals can be routed to any of the LAB lines 410 or local lines 430. Furthermore, logic (e.g., LE input multiplexers and LEs 420) within the LAB 400 may be used to provide multiplexer data input signals and multiplexer select signals to the multiplexing device 401.

Figure 5:
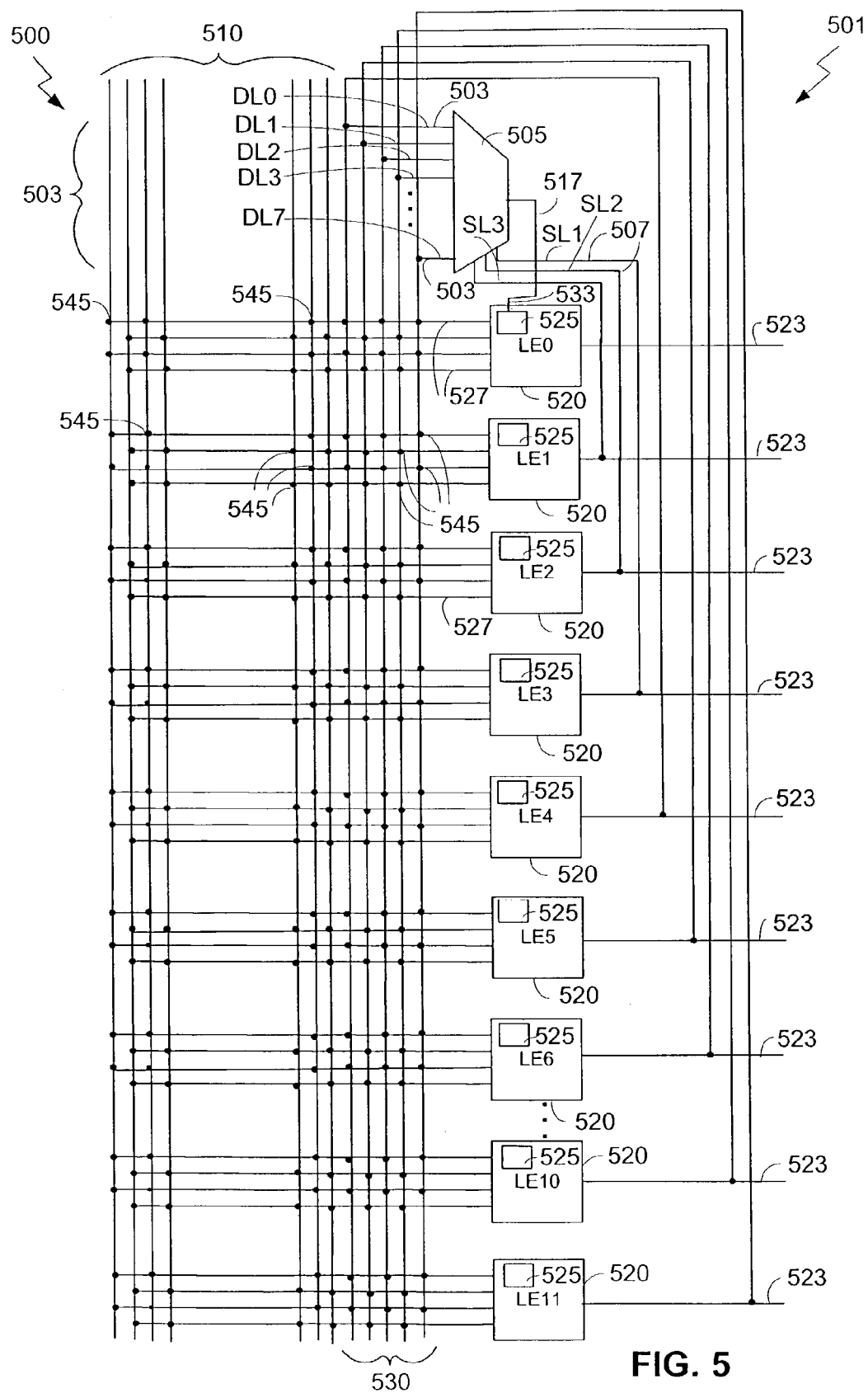
FIG. 5 shows a fifth embodiment of a multiplexing device including a hardwired multiplexer in a LAB.

FIG. 5 shows a fifth embodiment of a multiplexing device 501 including a hardwired multiplexer 505 in a LAB 500 of a PLD. The LAB 500 includes hardwired multiplexer 505, multiple LEs 520, multiple LAB lines 510, and multiple local lines 530. The LAB lines 510 carry both data input signals, select signals, and other signals for LAB 500. The LAB 500 also includes multiple LE input multiplexers. For a given LE input line 527, an LE input multiplexer includes the set of connections, such as connections 545, between the given LE input line 527 and the LAB lines 510 and the local lines 530. It is to be noted that, in FIG. 5, not all such connections between the LE input lines 527 and the LAB lines 510 and the local lines 530 have been referenced with the reference number 545 in order to avoid overcrowding the figure with reference numbers. The LE input multiplexers are controlled by configuration data from a random access memory (RAM) (not shown). Based on the configuration data, the LE input multiplexers select signals from one or more of the LAB lines 510 and local lines 530 for forwarding to the LEs 520.

The multiplexing device 501 includes a hardwired multiplexer 505 and several of the LEs 520. The hardwired multiplexer 505 has multiple data input terminals 503 DL0 through DL7, multiple select input terminals 507 SL1 through SL3 and an output terminal 517. Each LE 520 has multiple input terminals 527, an output terminal 523 and a LUT 525. As shown in FIG. 5, each of logic elements LE4-LE11 has its LE output terminal 523 coupled to the local lines 530. In one embodiment, all the LEs 520 may have their LE output terminals 523 coupled to the local lines 530. In one embodiment, the number of local lines 530 would correspond to the number of LEs 520. Each LE input terminal 527 of each LE 520 can receive signals from one of the LAB lines 510 or the local lines 530. The source of the signal depends on which of connections 545 is selected by the appropriate LE input multiplexer.

The hardwired multiplexer data input terminals 503 DL0 through DL7 are coupled to the output terminals 523 of the logic elements LE4 through LE11. More specifically, each of the multiplexer data input terminals 503 DL0 through DL7 is coupled to a corresponding one of the output terminals 523 of logic elements LE4 through LE11, such that multiplexer data input terminals 503 DL0 through DL7 are coupled to the output terminals 523 of logic elements LE4 through LE11, respectively. In one embodiment, each of the multiplexer data input terminals 503 is hardwired to the corresponding one of the output terminals 523 of logic elements LE4 through LE11. Similarly, the hardwired multiplexer select input terminals 507 SL1, SL2 and SL3 are coupled to the output terminals 523 of the logic elements LE3, LE2 and LE1. More specifically, each of the multiplexer select input terminals 507 is coupled to a corresponding one of the output terminals 523 of the logic elements LE3 through LE1, such that multiplexer select input terminals 507 SL1, SL2 and SL3 are coupled to the output terminals 523 of the logic elements LE3, LE2 and LE1, respectively. In one embodiment, each of the multiplexer select input terminals 507 is hardwired to the corresponding one of the output terminals 527 of the logic elements LE3 through LE1. The multiplexer output terminal 517 is coupled to the cascade input terminal 533 of the LUT 525 located within the logic element LE0.

A first implementation of this fifth embodiment of the multiplexing device 501 having dedicated hardware implemented in a LAB 500 of a PLD uses the combination of eight 2:1 soft multiplexers (which in the embodiment shown in FIG. 5 are implemented using LE4 through LE11) and the 8:1 dedicated multiplexer 505 to achieve a 16:1 multiplexer. However, any size multiplexer can be implemented. Additionally, although the multiplexing device 501 is a 16:1 multiplexer, it may be used as a smaller size multiplexer, e.g., an 8:1 multiplexer. The configuration RAM may be programmed so that the appropriate LE input multiplexers select the multiplexer data input signals from the LAB lines 510 or local lines 530. Two multiplexer data input signals are transmitted to each of the logic elements LE4 through LE11. For example, multiplexer data input signals D0 and D1 are input into the logic element LE4, multiplexer data input signals D2 and D3 are input into the logic element LE5 and multiplexer data input signals D14 and D15 are input into logic element LE11. However, it is to be noted that the present invention is not limited to the above assignment of the data signals D0-D15 to the logic elements LE4-LE11. In one embodiment, the assignment of the data signals D0-D15 to the logic elements LE4-LE11 may be in any order so long as each logic element receives one odd numbered data signal and one even numbered data signal of data signals D0-D15.

The configuration RAM may also be programmed so that the appropriate LE input multiplexers select the multiplexer select signals S0 through S3 from the LAB lines 510 or local lines 530. The multiplexer select signal S0 is transmitted to each of the logic elements LE4 through LE11. Similarly, the multiplexer select signals S3, S2 and S1 are transmitted to the logic elements LE1, LE2 and LE3, respectively. In one embodiment, the multiplexer select signal S0 is also transmitted to the logic elements LE1-LE3.

As noted above, the logic elements LE4 through LE11 function as 2:1 soft multiplexers. Each logic element LE4 through LE11 receives two multiplexer data input signals and a multiplexer select signal S0. Each logic element LE4 through LE11 outputs one of its two multiplexer data input signals based on the multiplexer select signal S0, thus reducing sixteen multiplexer data input signals down to eight. The output signals from the logic elements LE4 through LE11 are then transmitted to the appropriate hardwired multiplexer data input terminals 503. The LUTs 525 within the logic elements LE1, LE2 and LE3 may be programmed to simply output the multiple select signals S3, S2 and S1, respectively, and transmit them to the appropriate hardwired multiplexer select input terminals 507.

The hardwired multiplexer 505 generates an output signal based on the multiplexer select signals S3, S2 and S1. The output signal is transmitted from the multiplexer output terminal 517 to the cascade input terminal 533 of the LUT 525 located within the logic element LE0. The LUT 525 within the logical element LE0 may be programmed to manipulate the multiplexer output signal or to simply pass the multiplexer output signal to the output terminal 523 of the logical element LE0. In another embodiment, the multiplexer output terminal 517 may be coupled directly to other components such as multiplexers within the PLD which may be used to drive the routing, thus bypassing the logic element LE0.

In a second implementation of the fifth embodiment of the multiplexing device 501 having dedicated hardware implemented in a LAB 500 of a PLD, the logic elements LE1 through LE3 may be used to provide multiplexer select signals to the hardwired multiplexer 505. Similarly, logic elements LE4 through LE11 may be used to provide multiplexer data input signals to the hardwired multiplexer 505. The configuration RAM may be programmed so that the appropriate LE input multiplexers select LE input signals from the LAB lines 510 or local lines 530. The LE input signals are transmitted to the appropriate logic elements LE0 through LE11.

The LUTs 525 within the logic elements LE1 through LE3 may be programmed to output multiplexer select signals based on the LE input signals. Similarly, the LUTs 525 within the logic elements LE4 through LE11 may be programmed to output multiplexer data input signals based on the LE input signals. The multiplexer select signals are then transmitted from the output terminals 523 of the logic elements LE1 through LE3 to the appropriate hardwired multiplexer select input terminals 507. Likewise, the multiplexer data input signals are transmitted from the output terminals 523 of the logic elements LE4 through LE11 to the appropriate hardwired multiplexer data input terminals 503. The hardwired multiplexer 505 generates an output signal based on the multiplexer select signals. The output signal is transmitted from the multiplexer output terminal 517 to the cascade input terminal 533 of the LUT 525 located within the logic element LE0. The LUT 525 within the logical element LE0 may be programmed to manipulate the multiplexer output signal or to simply pass the multiplexer output signal to the output terminal 523 of the logical element LE0. In another embodiment, the multiplexer output terminal 517 may be coupled directly to other components such as multiplexers within the PLD which may be used to drive the routing, thus bypassing the logic element LE0.

The fifth embodiment of the multiplexing device 501 provides an advantage over the prior art "soft muxes" in that it is faster. The multiplexing device 501 also provides for greater flexibility in routing. In particular, the multiple multiplexer data input signals and the multiple multiplexer select signals can be routed to any of the LAB lines 510 or local lines 530. Furthermore, logic (e.g., LE input multiplexers and LEs 520) within the LAB 500 may be used to provide all of the multiplexer select signals and multiplexer data input signals input to the hardwired multiplexer 505.

It is to be noted that although the multiplexing device of the present invention has been described above in the context of a LAB, it may be used in other functional blocks of a PLD. For example, it may be implemented in a memory block, an input/output (I/O) interface block, or a digital signal processing (DSP) block of a PLD. It is also to be noted that more than one block of a PLD may include a multiplexing device of the present invention.

In the functional blocks mentioned above, a multiplexer such as hardwired multiplexer 105 of FIG. 1 may be implemented by coupling the data input terminals of the hardwired multiplexer to block input lines that carry data signals. More specifically, each of the data input terminals is coupled to a corresponding one of the block input lines, such that each of the data input terminals is coupled to a separate one of the block input lines. Furthermore, the select input terminals of the hardwired multiplexer are coupled to block input lines that carry select signals. More specifically, each of the select input terminals is coupled to a corresponding one of the block input lines, such that each of the select input terminals is coupled to a separate one of the block input lines. In one embodiment, each of the data input terminals and the select input terminals of the hardwired multiplexer is hardwired to its corresponding block input line. The output terminal of the hardwired multiplexer may be coupled to a functional element of the block. The functional element of the block can manipulate the output signal of the hardwired multiplexer or simply pass it to the output terminal of the functional element. In another embodiment, the output terminal of the hardwired multiplexer can be connected directly to other components such as multiplexers within the PLD which may be used to drive the routing, thus bypassing the functional element of the block. The block input lines couple the functional block to the PLD's general routing, i.e., the PLD's general interconnects. In one embodiment, the output terminals of the functional elements are coupled to the local lines.

In the functional blocks mentioned above, a multiplexer such as hardwired multiplexer 205 of FIG. 2 may be implemented by coupling the data input terminals of the hardwired multiplexer to block input lines that carry data signals. More specifically, each of the data input terminals is coupled to a corresponding one of the block input lines, such that each of the data input terminals is coupled to a separate one of the block input lines. Furthermore, the select input terminals of the hardwired multiplexer are coupled to output terminals of functional elements of the functional block. More specifically, each of the select input terminals is coupled to a corresponding one of the output terminals of the functional elements, such that each of the select input terminals is coupled to a separate one of the output terminals of the functional elements. In one embodiment, each of the data input terminals of the hardwired multiplexer is hardwired to its corresponding block input line. Similarly, each of the select input terminals of the hardwired multiplexer is hardwired to its corresponding functional element output terminal. The output terminal of the hardwired multiplexer may be coupled to a functional element of the block. The functional element of the block can manipulate the output signal of the hardwired multiplexer or simply pass it to the output terminal of the functional element. In another embodiment, the output terminal of the hardwired multiplexer can be connected directly to other components such as multiplexers within the PLD which may be used to drive the routing, thus bypassing the functional element of the block. The input terminals of the functional elements may be coupled to block input lines or local lines from which they receive signals. Input multiplexers select signals from one or more of the block input lines and local lines for forwarding to the functional elements. For a given input terminal of a functional element, an input multiplexer includes the set of connections between the given input terminal and the block input lines and local lines. In one embodiment, the input multiplexers are controlled by configuration data from a RAM. Based on the configuration data, the input multiplexers select signals from one or more of the block input lines and the local lines for forwarding to the functional elements. For each functional element input terminal, the corresponding input multiplexer determines from which of the block input lines or local lines the functional element input terminal would receive a signal. In one embodiment, the output terminals of the functional elements are coupled to the local lines.

In the functional blocks mentioned above, a multiplexer such as hardwired multiplexer 305 of FIG. 3 may be implemented by coupling the data input terminals of the hardwired multiplexer to input terminals of functional elements in the functional blocks. More specifically, each of the data input terminals is coupled to a corresponding one of the input terminals of the functional elements, such that each of the data input terminals is coupled to a separate one of the input terminals of the functional elements. Furthermore, the select input terminals of the hardwired multiplexer are coupled to input terminals of functional elements of the functional block. More specifically, each of the select input terminals is coupled to a corresponding one of the input terminals of the functional elements, such that each of the select input terminals is coupled to a separate one of the input terminals of the functional elements. In one embodiment, each of the data input terminals and the select input terminals of the hardwired multiplexer is hardwired to its corresponding functional element input terminal. The output terminal of the hardwired multiplexer may be coupled to a functional element of the block. The functional element of the block can manipulate the output signal of the hardwired multiplexer or simply pass it to the output terminal of the functional element. In another embodiment, the output terminal of the hardwired multiplexer can be connected directly to other components such as multiplexers within the PLD which may be used to drive the routing, thus bypassing the functional element of the block. As noted above, the input terminals of the functional elements may be coupled to block input lines or local lines from which they receive signals. Input multiplexers select signals from one or more of the block input lines and local lines for forwarding to the functional elements. For each functional element input terminal, the corresponding input multiplexer determines from which of the block input lines or local lines the functional element input terminal would receive a signal. In one embodiment, the output terminals of the functional elements are coupled to the local lines.

It is to be noted that the above description of the implementation of the multiplexing device of the present invention can apply to a functional block that is a LAB. When the functional block is a LAB, the block input lines are LAB lines, the functional elements are LEs, the input multiplexers are the LE input multiplexers, the input terminals of the functional elements are LE input terminals, and the output terminals of the functional elements are LE output terminals.

It is also to be noted that, in one embodiment of the multiplexing device of the present invention, the select signals for the multiplexing device, particularly the hardwired multiplexer of the multiplexing device, are accessible by the user. In other words, the user can route a select signal to a desired select terminal of the hardwired multiplexer through general routing of a PLD including the multiplexing device of the present invention. As used herein, a user refers to a person or device outside of the PLD that uses the PLD, where the PLD includes the multiplexing device of the present invention.

While the present invention has been particularly described with respect to the illustrated embodiments, it will be appreciated that various alterations, modifications and adaptations may be made based on the present disclosure, and are intended to be within the scope of the present invention. While the invention has been described in connection with the disclosed embodiments, it is to be understood that the present invention is not limited to the disclosed embodiments but, on the contrary, is intended to cover various modifications and equivalent arrangements included within the scope of the appended claims.

The invention claimed is:

1. A multiplexing device comprising:
   a hardwired multiplexer comprising:
      a plurality of input terminals;
      a plurality of select terminals; and
      at least one output terminal,
   wherein the plurality of input terminals are coupled to one of (1) a plurality of block input lines and (2) a plurality of functional element input terminals;
   wherein the plurality of select terminals are coupled to one of (1) a second plurality of functional element input terminals and (2) a plurality of functional element output terminals.

2. The multiplexing device of claim 1, wherein the plurality of input terminals are hardwired to one of (1) the plurality of block input lines and (2) the plurality of functional element input terminals.

3. The multiplexing device of claim 1, wherein the plurality of block input lines comprise a plurality of logic array block (LAB) lines, further wherein the plurality of functional element input terminals comprise a plurality of logic element (LE) input terminals.

4. The multiplexing device of claim 3, wherein the plurality of select terminals are coupled to one of (1) a second plurality of LE input terminals and (2) a plurality of LE output terminals.

5. The multiplexing device of claim 4, wherein the at least one output terminal is coupled to one of (1) a look up table (LUT) of an LE and (2) routing.

6. The multiplexing device of claim 3, wherein the plurality of input terminals are coupled to the plurality of LAB lines, further wherein each input terminal of the plurality of input terminals is coupled to a corresponding LAB line of the plurality of LAB lines.

7. The multiplexing device of claim 6, wherein the plurality of select terminal are coupled to a second plurality of LE input terminals, wherein each select terminal of the plurality of select terminals is coupled to a corresponding LE input terminal of the second plurality of LE input terminals.

8. The multiplexing device of claim 7, wherein the hardwired multiplexer is a 16×1 multiplexer, the plurality of input terminals comprise 16 input terminals, and the plurality of select terminals comprise 4 select terminals.

9. The multiplexing device of claim 6, wherein the plurality of select terminal are coupled to a plurality of LE output terminals, wherein each select terminal of the plurality of select terminals is coupled to a corresponding LE output terminal of the plurality of LE input terminals.

10. The multiplexing device of claim 9, wherein the hardwired multiplexer is a 16×1 multiplexer, the plurality of input terminals comprise 16 input terminals, and the plurality of select terminals comprise 4 select terminals.

11. The multiplexing device of claim 3, wherein the plurality of input terminals are coupled to the plurality of logic element (LE) input terminals, wherein each input terminal of the plurality of input terminals is coupled to a corresponding LE input terminal of the plurality of LE input terminals, further wherein the plurality of select terminals are coupled to a second plurality of LE input terminals, wherein each select terminal of the plurality of select terminals is coupled to a corresponding LE input terminal of the second plurality of LE input terminals.

12. The multiplexing device of claim 11, wherein the hardwired multiplexer is a 16×1 multiplexer, the plurality of input terminals comprise 16 input terminals, the plurality of select terminals comprise 4 select terminals, the plurality of LE input terminals comprise LE input terminals of 4 LEs, wherein each LE of the 4 LEs comprises 4 LE input terminals, and the second plurality of LE input terminals comprise LE input terminals of one LE.

13. A LAB comprising at least one of the multiplexing device of claim 1.

14. An input/output interface block comprising the multiplexing device of claim 1.

15. A memory block comprising the multiplexing device of claim 1.

16. A digital signal processing block comprising the multiplexing device of claim 1.

17. A programmable logic device (PLD) comprising the multiplexing device of claim 1.

18. A multiplexing device comprising:
   a hardwired multiplexer comprising a plurality of data signal input terminals and a plurality of select signal terminals;
   a first plurality of logic elements (LEs) comprising a first plurality of LE output terminals; and
   at least one LE comprising a plurality of LE input terminals,
   wherein the plurality of data signal input terminals are coupled to the first plurality of LE output terminals and the plurality of select signal terminals are coupled to the plurality of LE input terminals.

19. The multiplexing device of claim 18 further comprising a second plurality of LEs comprising a second plurality of LE output terminals, wherein the hardwired multiplexer further comprises a plurality of select signal terminals, further wherein the plurality of select signal terminals are coupled to the second plurality of LE output terminals.

20. The multiplexing device of claim 19, wherein the hardwired multiplexer further comprise at least one output terminal, wherein the at least one output terminal is coupled to one of (1) a look up table (LUT) of an LE of the second plurality of LEs and (2) routing.

21. The multiplexing device of claim 18, wherein the first plurality of LEs receive N input data signals and provide N/2 input data signals of the N input data signals to the plurality of data signal input terminals of the hardwired multiplexer, wherein N is an even integer.

22. The multiplexing device of claim 21, wherein the first plurality of LEs receive 16 input data signals and provide 8 input data signals to the plurality of data signal input terminals of the hardwired multiplexer.

23. The multiplexing device of claim 18, wherein each data signal input terminal of the plurality of data signal input terminals is coupled to one corresponding LE output terminal of the first plurality of LE output terminals.

24. The multiplexing device of claim 19, wherein each select signal terminal of the plurality of select signal terminals is coupled to a corresponding LE output terminal of the second plurality of LE output terminals.

25. The multiplexing device of claim 24, wherein the hardwired multiplexer is an 8×1 multiplexer, the plurality of select signal terminals comprises 3 select signal terminals, the first plurality of LEs comprises 8 LEs, and the second plurality of LEs comprises 3 LEs.

26. The multiplexing device of claim 18, wherein each select signal terminal of the plurality of select signal terminals is coupled to a corresponding LE input terminal of the plurality of LE input terminals.

27. The multiplexing device of claim 26, wherein the hardwired multiplexer comprises an 8×1 multiplexer, the plurality of select signal terminals comprises 3 select signal terminals, the first plurality of LEs comprises 8 LEs, and the at least one LE comprises 3 LE input terminals coupled to the 3 select signal terminals.

28. The multiplexing device of claim 18, wherein the first plurality of LEs are coupled to a plurality of LAB data lines and a plurality of LAB select lines.

29. The multiplexing device of claim 28, wherein each LE of the first plurality of LEs receives two data signals from the plurality of LAB data lines and one select signal from the plurality of LAB select lines, further wherein each LE of the plurality of LEs provides one data signal of the two data signals to a corresponding data signal input terminal of the plurality of data signal input terminals.

30. A LAB comprising at least one of the multiplexing device of claim 18.

31. A programmable logic device (PLD) comprising the multiplexing device of claim 18.

32. A method of multiplexing a plurality of data input signals, comprising:
  receiving the plurality of data input signals from one of (1) a plurality of block input lines and (2) a plurality of functional element input terminals;
  receiving a plurality of select signals;
  using a hardwired multiplexer to select at least one data signal from the plurality of data input signals; and
  outputting the at least one data signal,
  wherein the receiving the plurality of select signals comprises receiving the plurality of select signals from one of (1) a second plurality of functional element input terminals and (2) a plurality of functional element output terminals.

33. The method of claim 32, wherein the receiving the plurality of data input signals comprises receiving the plurality of data input signals via input terminals of the hardwired multiplexer are hardwired to one of (1) the plurality of block input lines and (2) the plurality of functional element input terminals.

34. The method of claim 32, receiving the plurality of data input signals comprises receiving the plurality of data input signals from one of (1) a plurality of logic array block (LAB) lines and (2) a plurality of logic element (LE) input terminals.

35. The method of claim 33, wherein the receiving the plurality of select signals comprises receiving the plurality of select signals from one of (1) a second plurality of LE input terminals and (2) a plurality of LE output terminals.

36. The method of claim 35, wherein the outputting comprises sending the at least one data signal to one of (1) a look up table (LUT) of an LE and (2) routing.

37. The method of claim 34, wherein the receiving the plurality of data input signals comprises receiving the plurality of data input signals from the plurality of LAB lines, further wherein each data input signal of the plurality of data input signals is received from a corresponding LAB line of the plurality of LAB lines.

38. The method of claim 37, wherein the receiving the plurality of select signals comprises receiving the plurality of select signals from a second plurality of LE input terminals, wherein each select signal of the plurality of select signals is received from a corresponding LE input terminal of the second plurality of LE input terminals.

39. The method of claim 37, wherein the receiving the plurality of select signals comprises receiving the plurality of select signals from a plurality of LE output terminals, wherein each select signal of the plurality of select signals is received from a corresponding LE output terminal of the plurality of LE input terminals.

40. The method of claim 34, wherein the receiving the plurality of data input signals comprises receiving the plurality of data input signals from the plurality of logic element (LE) input terminals, further wherein each data input signal of the plurality of data input signals is received from a corresponding LE input terminal of the plurality of LE input terminals, further wherein the receiving the plurality of select signals comprises receiving the plurality of select signals from a second plurality of LE input terminals, wherein each select signal of the plurality of select signals is received from a corresponding LE input terminal of the second plurality of LE input terminals.

41. The method of claim 32, wherein the using of the hardwired multiplexer comprises using a 16×1 hardwired multiplexer.

42. A method of multiplexing a plurality of data input signals comprising:
  receiving the plurality of data input signals;
  using a first plurality of logic elements (LEs) to select a first subset of data input signals from the plurality of data input signals;
  receiving the first subset of data input signals at a hardwired multiplexer;
  using the hardwired multiplexer to select at least one data signal from the first subset of data input signals; and
  outputting the at least one data signal.

43. The method of claim 42, wherein the outputting comprises sending the at least one data signal to one of (1) a look up table (LUT) of an LE and (2) routing.

44. The method of claim 42 further comprising:
  receiving a plurality of select signals at the hardwired multiplexer, wherein the plurality of select signals are received from a plurality of LE input terminals, further wherein each signal of the plurality of select signals is received from a corresponding LE input terminal of the plurality of LE input terminals.

45. The method of claim 42 further comprising:
receiving a plurality of select signals at the hardwired multiplexer, wherein the plurality of select signals are received from a second plurality of LE output terminals, further wherein each signal of the plurality of select signals is received from a corresponding LE output terminal of the second plurality of LE output terminals.

46. The method of claim 42, wherein using the first plurality of LEs comprises using 8 LEs to select 8 data input signals from 16 data input signals, further wherein receiving the first subset of data input signals comprises receiving the 8 data input signals at the hardwired multiplexer, wherein each data input signal of the 8 data input signals is received form a corresponding LE of the 8 LEs, further wherein the hardwired multiplexer comprises an 8×1 multiplexer.

47. The method of claim 42, wherein receiving the plurality of data input signals comprises receiving the plurality of data input signals from a plurality of LAB data lines, the method further comprising:
receiving at the first plurality of LEs a plurality of select signals from a plurality of LAB select lines, wherein the first plurality of LEs use the plurality of select signals to select the first subset of data input signals from the plurality of data input signals.

48. The method of claim 47, wherein receiving the plurality of data input signals comprises receiving two data input signals at each LE of the first plurality of LEs, further wherein receiving at the first plurality of LEs the plurality of select signals comprises receiving one select signal of the plurality of select signals at each LE of the first plurality of LEs, further wherein using the first plurality of LEs comprises using each LE of the plurality of LEs to select one data input signal of the two data input signals.

* * * * *